United States Patent
Chih-Sheng

(10) Patent No.: US 9,231,578 B2
(45) Date of Patent: Jan. 5, 2016

(54) APPARATUS AND METHOD FOR OBTAINING AUXILIARY VOLTAGE FROM CONTROL SIGNALS

(75) Inventor: Chen Chih-Sheng, Taipei (TW)

(73) Assignee: RichWave Technology Corp., Taipei (TW)

( * ) Notice: Subject to any disclaimer, the term of this patent is extended or adjusted under 35 U.S.C. 154(b) by 213 days.

(21) Appl. No.: 13/345,022

(22) Filed: Jan. 6, 2012

(65) Prior Publication Data

US 2013/0176074 A1    Jul. 11, 2013

(51) Int. Cl.
```
H03K 17/687    (2006.01)
H03K 17/60     (2006.01)
G11C 5/14      (2006.01)
H03K 17/00     (2006.01)
H03K 17/693    (2006.01)
```

(52) U.S. Cl.
CPC ............ *H03K 17/007* (2013.01); *H03K 17/693* (2013.01)

(58) Field of Classification Search
CPC . H03K 17/007; H03K 17/693; H03K 17/002; H03K 17/735; H03K 17/76
USPC .......................................... 327/427, 434, 530
See application file for complete search history.

(56) References Cited

U.S. PATENT DOCUMENTS

| | | | |
|---|---|---|---|
| 3,942,039 A * | 3/1976 | Kikuchi et al. | 327/389 |
| 5,717,356 A * | 2/1998 | Kohama | 327/427 |
| 7,173,471 B2 * | 2/2007 | Nakatsuka et al. | 327/308 |
| 7,460,852 B2 | 12/2008 | Burgener et al. | |
| 7,796,969 B2 | 9/2010 | Kelly | |
| 8,093,940 B2 * | 1/2012 | Huang et al. | 327/430 |
| 2006/0000147 A1 | 1/2006 | Pieper | |
| 2006/0001473 A1 | 1/2006 | Yasuda et al. | |
| 2009/0206910 A1 | 8/2009 | Takahashi et al. | |

FOREIGN PATENT DOCUMENTS

| | | |
|---|---|---|
| EP | 0720292 A1 | 7/1996 |
| EP | 1487103 A2 | 12/2004 |
| JP | 2000223902 | 8/2000 |
| JP | 2001068984 A | 3/2001 |
| TW | 200744315 | 12/2007 |
| WO | 2012070162 A1 | 5/2012 |

* cited by examiner

*Primary Examiner* — Lincoln Donovan
*Assistant Examiner* — Colleen O Toole
(74) *Attorney, Agent, or Firm* — Winston Hsu; Scott Margo

(57) ABSTRACT

An auxiliary voltage generating unit for a radio frequency switch includes a first input and a second input respectively configured to receive a first control signal and a second control signal, wherein the first control signal and the second control signal are configured to control which one of a plurality of paths in the radio frequency switch is enabled, and at least one output, configured to output an auxiliary voltage, derived from at least one of the first control signal or the second control signal, that is used to operate the radio frequency switch. The auxiliary voltage may be a bias voltage and/or a voltage used to power an inverter used to enable a selected branch as an isolation branch or shunt branch.

20 Claims, 4 Drawing Sheets

APPARATUS AND METHOD FOR OBTAINING AUXILIARY VOLTAGE FROM CONTROL SIGNALS

FIELD OF THE INVENTION

The present invention relates to solid state radio frequency switches. More particularly, the present invention relates to a convenient approach to obtain bias and other auxiliary voltages from switch control signals or voltages.

BACKGROUND OF THE INVENTION

Radio frequency (RF) switches are important building blocks in many wired and wireless communication systems. RF switches are found in many different communication devices such as cellular telephones, wireless pagers, wireless infrastructure equipment, satellite communications equipment, and cable television equipment. As is well known, the performance of RF switches may be characterized by one of any number operating performance parameters including insertion loss and switch isolation. Performance parameters are often tightly coupled, and any one parameter can be emphasized in the design of RF switch components at the expense of others. Other characteristics that are important in RF switch design include ease and degree (or level) of integration of the RF switch, complexity, yield, return loss and, of course, cost of manufacture.

FIG. 5 shows a pseudomorphic High Electron Mobility Transistor (pHEMT) RF switch 500 according to the prior art. Switch 500 includes an RF common (RFC) input node 501 and two RF output nodes RF1 (502), RF2 (503). Coupling/DC blocking capacitors are also shown at each of the nodes 501-503 but are ignored for purposes of the instant description. Those skilled in the art will appreciate that such capacitors impede the passage of DC current, yet do not appreciably impact an AC signal.

As further shown, several transistors M51, M52, M53, and M54 are arranged to effect RF communication between RFC 501 and RF1 502, or between RFC 501 and RF2 503. Specifically, M51 is arranged between RFC 501 and RF1 502, M52 is arranged between RF1 502 and ground, M53 is arranged between RFC 501 and RF2 503, and M54 is arranged between RF2 503 and ground. Each of the transistors M51-M54 includes by-pass resistors (which are not labeled with reference numerals) connected between respective drain and source terminals.

Two control voltages VC1 and VC2 applied, respectively, to the gates of M51 and M53 control which path (RFC to RF1 or RFC to RF2) will be taken by an RF AC signal input at RFC 501. In the configuration shown, VC1 is 3.3V, which turns M51 on. VC2 is 0V, which turns M53 off. In this configuration the RF path is configured to be RFC to RF1. M52 and M54 operate to enable either an isolation branch or a shunt branch depending on which path (RFC to RF1 or RFC to RF2) is selected. That is, when VC1 is high (3.3V), VC1B (the control voltage applied to the gate of M52) is controlled to be low, e.g., 0V. With VC1B low, M52 is off thereby isolating the path between RFC 501 and RF1 502. Meanwhile, VC2B is set high thus turning M54 on and creating an AC signal shunt path between output node RF2 503 and ground to ensure that no signal (or very little) is present at RF2 503, when RF2 503 is not selected to output the AC signal received at RFC 501. The several control voltages VC1, and VC2 are applied via respective resistors (which are also not labeled with reference numerals).

For high power operation for the switch shown in FIG. 5, the voltage of node 525 must be high enough to not only make control switch M51 forward biased with a positive Vgs over drive (VC1—"the voltage at node 525) to reduce turn-on insertion loss, but also to maintain sufficient reverse bias of control switch M53 (0—"voltage at node 525") to avoid turn-on during high power voltage swings.

For a depletion pHEMT device, threshold voltage (Vth) is about −1V. Due to the relatively large leakage current in a pHEMT device, two back-to-back diodes 520, 521 form a Kirchoff Voltage Law (KVL) node. Specifically, with VC1=3.3 voltage volts, the drop across diode 520 is approximately 0.7V, which causes a voltage of 2.6V to be present at node 525. With a voltage of 2.6V at node 525, Vgs for M52 (which is reversed biased) is 0V-2.6V, or −2.6V. The point here is that as a result of the leakage current, node 525 is set at 2.6V which is suitable for handling high power RF switch operations, and as a result, no auxiliary biasing is needed to support a high power RF switch implemented with pHEMT devices.

Unlike pHEMT device-based RF switches, silicon-based RF switches permit much less leakage current. As such, silicon-based RF switches operating in high power scenarios require special biasing circuitry and voltages to operate properly. There is accordingly a need to provide cost effective ways of providing such biasing circuitry and voltages in silicon-based RF switching devices.

SUMMARY OF THE INVENTION

Embodiments of the present invention provide an auxiliary voltage generating unit for a radio frequency switch including a first input and a second input respectively configured to receive a first control signal and a second control signal, wherein the first control signal and the second control signal are configured to control which one of a plurality of paths in the radio frequency switch is enabled, and at least one output, configured to output an auxiliary voltage, derived from at least one of the first control signal or the second control signal, that is used to operate the radio frequency switch. The auxiliary voltage may be a bias voltage and/or a voltage used to power an inverter used to enable a selected branch as an isolation branch or shunt branch.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE PREFERRED EMBODIMENTS

Figure 1:
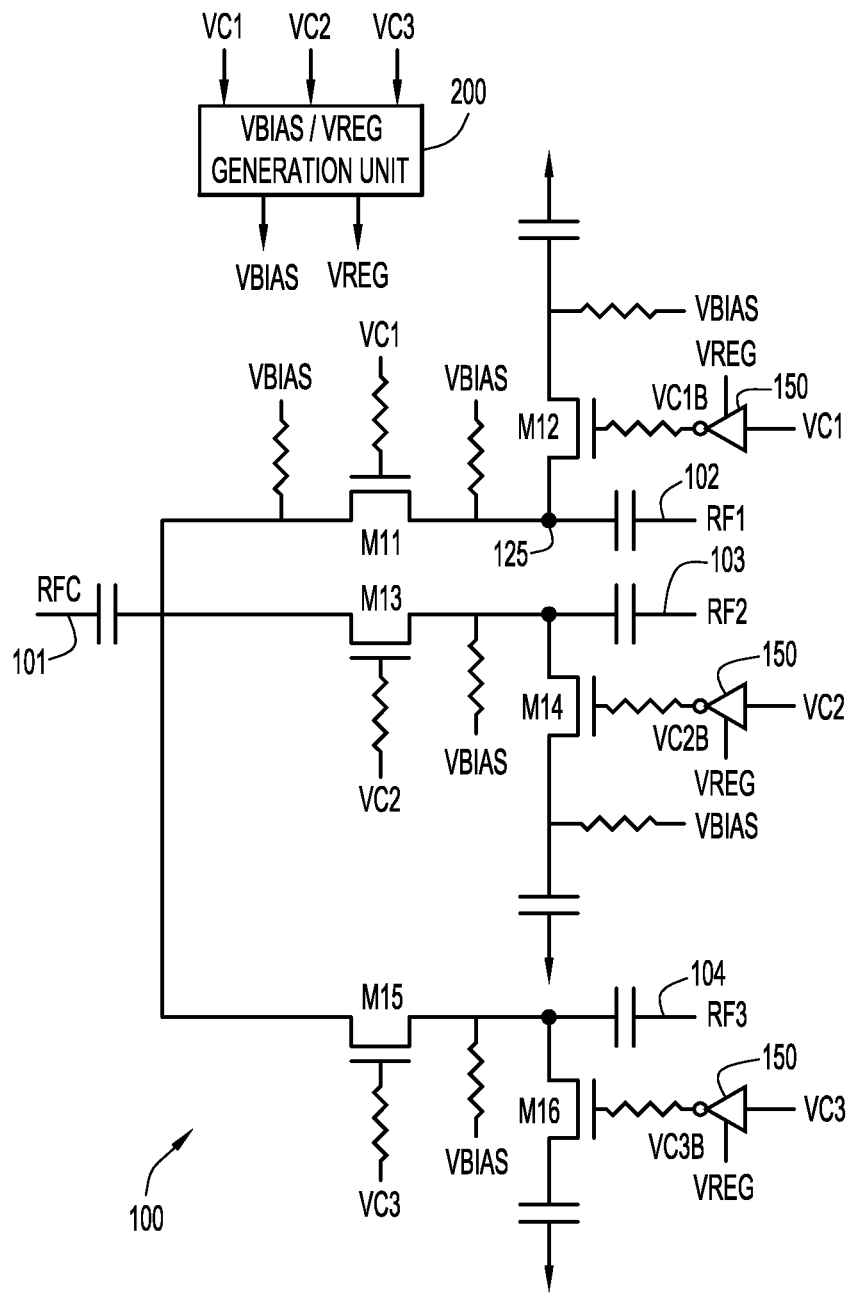
FIG. 1 shows an RF switch including a VBIAS and VREG generation unit in accordance with an embodiment of the present invention.

Reference is now made to FIG. 1, which depicts a silicon based transistor RF switch 100 configured as a single-poletriple-throw switch. With such a switch, three RF paths may be defined from RFC 101: a path from RFC 101 to RF1 102, a path from RFC 101 to RF2 103 and a path from RFC 101 to RF3 104.

Figure 5:
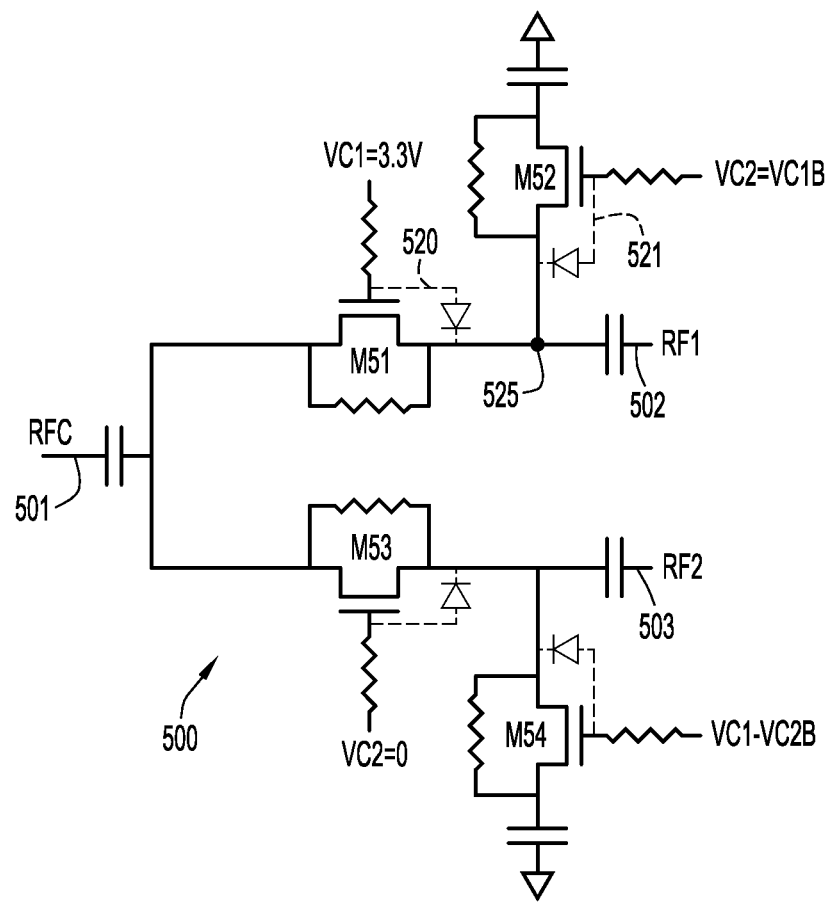
FIG. 5 shows a prior art pHEMT-implemented RF switch for which no auxiliary voltages are needed for high power operation.

In switch 100, as in switch 500, several transistors are employed to control which path is enabled and thereby permit an RF signal to pass. In the case of switch 100, transistors M11, M13 and M15 are employed as the main path controllers, while transistors M12, M14 and M16 are controlled to isolate a given path or to enable an AC shunt path for non-selected pathways. Unlike the switch 500 in FIG. 5, however, the transistors in switch 100 are silicon-based transistors.

The following table shows the control voltages VC1, VC2 and VC3 that are employed to control RF switch 100. Corresponding control signals VC1B, VC2B, and VC3B are arranged to be the inverse of VC1, VC2, and VC3 by passing VC1, VC2, and VC3 through appropriate inverters 150.

| states | VC1 | VC2 | VC3 |
| --- | --- | --- | --- |
| RFC-RF1 | 3.3 | 0 | 0 |
| RFC-RF2 | 0 | 3.3 | 0 |
| RFC-RF3 | 0 | 0 | 3.3 |

More specifically, to have an RF signal pass from RFC 101 to RF1 102, for example, VC1 is set high and VC2 and VC3 are set low. To have an RF signal pass from RFC 101 to RF2 103, VC2 is set high and VC1 and VC3 are set low. And, to have an RF signal pass from RFC 101 to RF3 104, VC3 is set to high and VC2 and VC1 are set low.

In silicon based transistors, gate leakage current is typically very small. Thus, the voltage at node 125 (shown in the top path of the switch 100 between RFC 101 and RF1 102) will almost always be close to 0V since, e.g., the bypass resistor disposed across M12 is connected to ground via a DC blocking capacitor. (Node 125 is used as an example, and those skilled in the art will appreciate that the discussion herein applies equally to corresponding nodes in the other branches of the switch 100.) However, if node 125 is maintained at 0V DC, the switch does not operate well in high power scenarios. Just as in the pHEMT implementation of FIG. 5, node 125 is preferably set at a higher voltage than 0V to ensure forward biasing of M11 and reverse biasing of M12 (in the case of the top branch of switch 100)

To obtain the desired voltage at node 125 and support high power operations of the switch 100, a separate voltage source is employed to apply a bias signal, namely "VBIAS," to multiple nodes in each branch and path of switch 100. Taking the top branch or path as an example, VBIAS is applied between RFC 101 and M11, at node 125, and between M12 and ground. VBIAS may be on the order of 1.6V or higher. When VBIAS is applied in this manner, the entire segment of the switch, including its respective path, isolation and shunt branches are biased to the level of the applied VBIAS voltage. As a result, the silicon-based RF switch 100 can properly operate in high power scenarios.

In addition (and not shown in FIG. 5), inverters 150 must be powered to supply signals VC1B, VC2B and VC3B to operate the isolation and shunt branches. In FIG. 1, the supply power for the respective inverters 150 is provided by a voltage labeled "VREG" The outputs of the inverters 150 are the inverse of the input signals VC1, VC2, VC3, resulting in VC1B, VC2B and VC3B, which are supplied to the appropriate shunt/isolation branch of each path of the switch 100.

In accordance with an embodiment of the present invention, and as further shown in FIG. 1, a VBIAS/VREG generation unit 200 is provided. As will be explained below, VBIAS/VREG generation unit 200 can be fabricated as part of the switch circuitry itself. VBIAS/VREG generation unit 200 receives inputs VC1, VC2 and VC3 (or however many control signals there may be) and generates from at least one of those control signals appropriate voltages for VBIAS and VREG that are then employed as described above. In one embodiment, generated VBIAS is about 1.6V and generated VREG is about 2.6V.

Figure 2A:
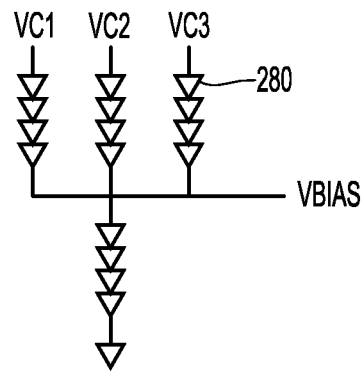
FIGS. 2A-2E show circuitry for possible implementations of the VBIAS and VREG generation unit in accordance with embodiments of the present invention.
Figure 2B:
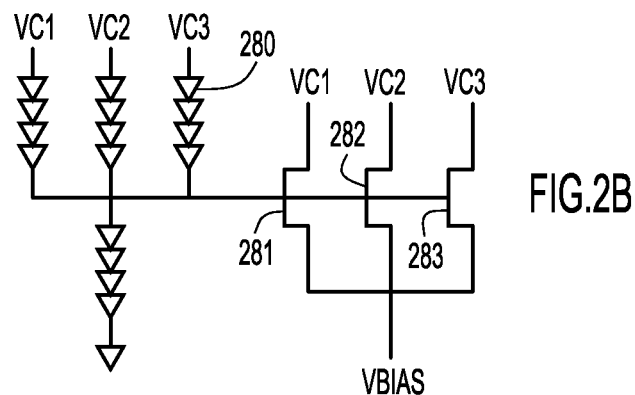
Figure 2C:
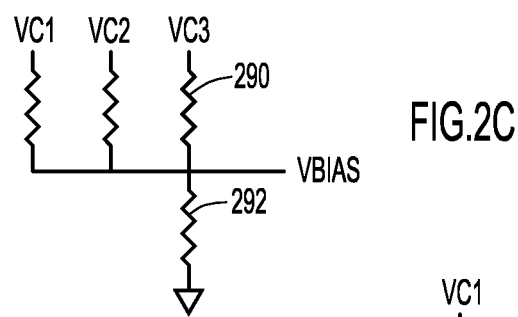

FIGS. 2A-2C show possible embodiments of the internal circuitry of VBIAS/VREG generation unit 200. FIG. 2A, for example, depicts a voltage divider comprised of a plurality of diodes 280. Assuming VC1 is 3.3V and VC2 and VC3 are 0V, then a voltage divider comprised of an appropriate number of such diodes can provide the desired VBIAS voltage level.

FIG. 2B shows another embodiment similar to that shown in FIG. 2A, but further includes transistors 281-283 configured as source followers that are arranged to be turned on by application of a voltage from the diode-implemented voltage divider and to have drain nodes connected, respectively, to VC1, VC2 and VC3. Thus, one of transistors 281-283 will always supply the VBIAS voltage since one of VC1, VC2 or VC3 is always high. In the case of a switch with more than three branches, additional control signals VC4, . . . VCn can be added to the circuit, such that there is always at least one "high" control signal that can supply power for the VBIAS signal.

The diodes 280 themselves may be formed any number of ways including with stand alone p-n junctions, NMOS or PMOS transistors connected to operate as diodes, or bipolar transistors connected to operate as diodes, and transistors 281-283 can be native MOS or standard MOS to enhance sourcing current capability. Such devices can be formed in a same semiconductor substrate in which the switch 100 is fabricated, resulting in reduced manufacturing costs.

FIG. 2C shows yet a third possible embodiment to supply the VBIAS voltage. In this particular arrangement a voltage divider comprised of resistors 290 is provided and VBIAS is taken from node 292. Those skilled in the art will appreciate that the values of the resistors can be selected to obtain the desired voltage level for VBIAS.

Figure 2D:
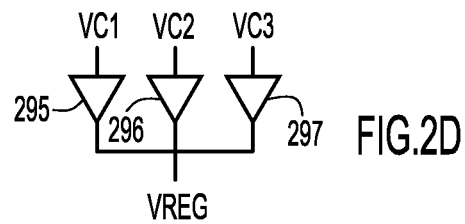

FIG. 2D shows a possible implementation of circuitry within VBIAS/VREG generation unit 200 to generate VREG. In the configuration shown, three diodes 295-297 are arranged to be connected, respectively, to VC1, VC2 and VC3. Consequently, when VC1, VC2 or VC3 is high, a voltage drop occurs across the associated diode 295, 296 or 297 and the desired VREG voltage can be obtained. Thus, for example, with VC1, VC2 and VC3 on the order of 3.3V, the VREG voltage will be 3.3V-0.7V=2.6V, which is sufficient to power the inverters 150 shown in FIG. 1.

Figure 2E:
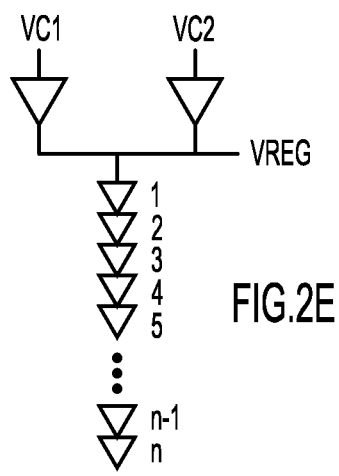

FIG. 2E shows another possible implementation of circuitry to generate VREG. In the circuit shown, VREG is obtained via a voltage divider comprising a plurality of diodes 1 to n. VREG may be calculated as VREG=VC1*n/(n+1) or VREG=VC2*n/(n+1). VC3 could also be used as a source voltage.

Based on the forgoing, those skilled in the art will appreciate that embodiments of the present invention enable a silicon-based RF switch that is capable of operating in high power scenarios without the need for external voltages to obtain VBIAS and/or VREG voltages for proper operation. In accordance with embodiments of the present invention, VBIAS and VREG are obtained directly from control signals (e.g., VC1, VC2, VCn) that are used to control which path of the switch an RF signal is to take from an RF common or input node to an output node. VC1, VC2, VCn, for instance, are pins that might be found on an RF switch implemented as an integrated circuit. Without the need for yet more pins to supply VBIAS and/or VREG, the packaging and overall circuit layout of such an integrated circuit can be simplified, resulting in reduced cost.

Figure 3:
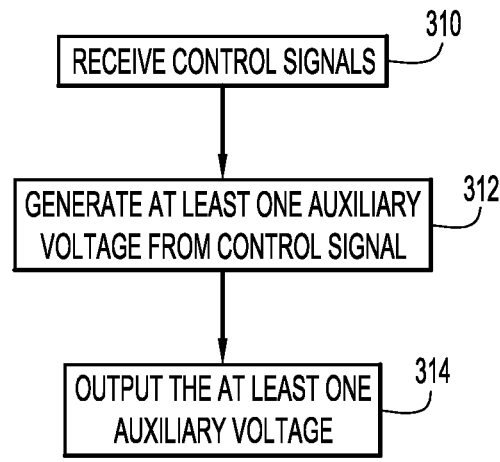
FIGS. 3 and 4 depict a series of operations that may be performed in accordance with embodiments of the present invention.

FIG. 3 depicts a series of operations that may be performed in accordance with an embodiment of the present invention. Reference may also be made to FIG. 1, and in particular, VBIAS/VREG generation circuit 200 in connection with the explanation of FIG. 3. At 310, control signals are received. These signals may be, for instance, the control signals that are used to enable a selected path/branch of an RF switch. In the discussion above, such control signals might correspond to, e.g., VC1, VC2, etc. At 312, at least one auxiliary voltage is generated from at least one of the control signals. In the implementations described above, the auxiliary voltage could be a VBIAS voltage used to bias one or more paths/branches of an RF switch, and/or a VREG voltage used to power an inverter used to obtain the inverse of VC1, VC2, etc. At 314, the at least one auxiliary voltage is output.

Figure 4:
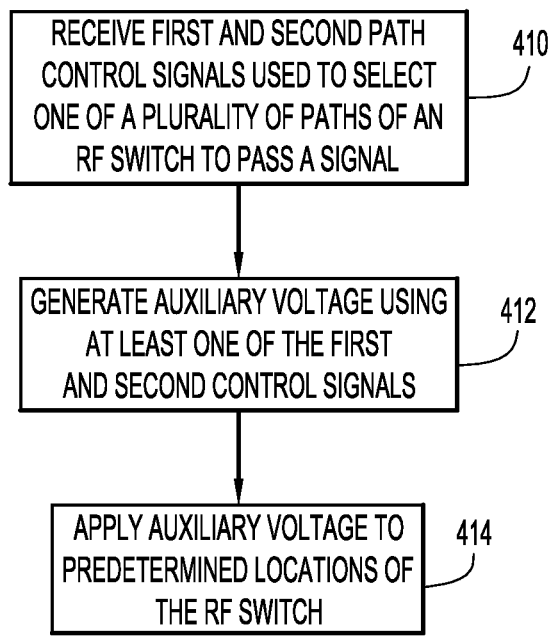

FIG. 4 depicts yet another series of operations that may be performed in accordance with an embodiment of the present invention. At 410, first and second path control signals are applied to paths of an RF switch to select one of a plurality of paths via which to pass an RF signal. At 412, at least one auxiliary voltage is generated using at least one of the first and second control signals. And, at 414, the at least one auxiliary voltage is applied to predetermined nodes of the RF switch.

As those skilled in the art will appreciate, the auxiliary voltages may be a VBIAS voltage that is applied to maintain certain nodes along respective branches of the RF switch at a voltage level sufficient to sustain high power operation, or a VREG voltage that may be used to power an inverter which is used to invert control signals to enable isolation or shunt branches within the RF switch. In either case, by generating such auxiliary voltages using control signals, it is possible to simplify the design of, e.g., a silicon-based RF switch. That is, no separate, external-supplied VBIAS and VREG are needed.

While the invention has been described in terms of what is presently considered to be the most practical and preferred embodiments, it is to be understood that the invention needs not to be limited to the above embodiments. On the contrary, it is intended to cover various modifications and similar arrangements which are to be accorded with the broadest interpretation so as to encompass all such modifications and similar structures.

What is claimed is:

1. A voltage generating unit for a radio frequency switch, comprising:
    a first input and a second input respectively configured to receive a first control signal and a second control signal, wherein the first control signal and the second control signal are configured to control which one of a plurality of paths in the radio frequency switch is enabled;
    wherein the first and second inputs are coupled to a first output through respective first and second voltage drop circuits such that a power voltage based on the first and second control signals is derived at the first output, and
    wherein the power voltage is used to operate the radio frequency switch and power first and second inverters of the first and second switch paths, respectively, that receive and invert respective ones of the first and second control signals.

2. The voltage generating unit of claim 1, wherein the first and second inputs are coupled to a second output through respective third and fourth voltage drop circuits such that a bias voltage based on the first and second control signals is derived at the second output, the bias voltage being applied as a bias voltage to the first and second switch paths.

3. The voltage generating unit of claim 1, further comprising a circuit comprising diodes configured to reduce a voltage level of the first or the second control signal.

4. The voltage generating unit of claim 3, wherein the diodes are configured to operated as a voltage divider.

5. A radio frequency (RF) switch, comprising:
    an RF common terminal, a first RF output, and a second RF output;
    a first semiconductor switching device controlled by a first control signal and disposed between the RF common terminal and the first RF output in a first path of the RF switch;
    a second semiconductor switching device controlled by a second control signal and disposed between the RF common terminal and the second RF output in a second path of the RF switch;
    first and second branches, connected to the first and second paths, respectively, comprising third and fourth semiconductor switching devices, respectively; and
    first and second inverters having respective outputs connected to respective control terminals of the third and fourth switching devices; and
    a voltage generating unit including first and second inputs to receive the first and second control signals, respectively, and a first output coupled to the first and second inputs through respective first and second voltage drop circuits such that a power voltage based on the first and second control signals is derived at the first output, the power voltage being used to power the first and second inverters.

6. The RF switch of claim 5, wherein the voltage generating unit is configured to generate a bias voltage at a second output of the generating unit from the first and second control signals and apply the bias voltage to first and second nodes along the first and second paths, respectively.

7. The RF switch of claim 5, wherein the voltage generating unit comprises a plurality of diodes.

8. The RF switch of claim 7, wherein the plurality of diodes are arranged as a voltage divider.

9. The RF switch of claim 6, wherein the voltage generating unit comprises at least one transistor configured in a circuit as a source follower from which the bias voltage is obtained.

10. The RF switch of claim 6, wherein the bias voltage and the power voltage are different.

11. The RF switch of claim 6, wherein the bias voltage is about 1.6V and the power voltage is about 2.6V.

12. A method of generating one or more voltages used to operate a radio frequency switch, comprising:
    receiving at first and second inputs respective first and second control signals that are used to enable first and second paths of the radio frequency switch, respectively;
    coupling the first and second inputs to an output through respective first and second voltage drop circuits such that a power voltage based on the first and second control signals is derived at the output; and
    wherein the power voltage is used to power first and second inverters that supply first and second inverted versions of the first and second control signals, respectively, to the first and second paths, respectively.

13. The method of claim 12, further comprising generating a bias voltage from the first and second control signals and that biases the first and second paths of the radio frequency switch.

14. The method of claim 13, wherein the power and bias voltages are different.

15. The method of claim 14, wherein the bias voltage is about 1.6V and the power voltage is about 2.6V.

16. The method of claim 12, wherein generating the power voltage comprises applying at least one of the first and second control signals to a voltage divider.

17. The method of claim 16, wherein the voltage divider comprises a plurality of diodes.

18. The voltage generating unit of claim 1, wherein the first and second control signals each switch between high and low voltage levels to control the first and second switch paths and are complimentary to each other such that the power voltage is configured to provide power to the first and second inverters if one of the control signals is at a low voltage while the other of the control signals is at a high voltage.

19. The voltage generating unit of claim 1, wherein:

the first voltage drop circuit includes a first diode, connected between the first input and output, configured to reduce a voltage level of the first control signal; and the second voltage drop circuit includes a second diode, connected between the second input and the at least one output, configured to reduce a voltage level of the second control signal.

20. The voltage generating unit of claim 1, wherein:

the first voltage drop circuit includes a first resistor, connected between the first input and the at least one output, configured to reduce a voltage level of the first control signal; and the second voltage drop circuit includes a second resistor, connected between the second input and the at least one output, configured to reduce a voltage level of the second control signal.

\* \* \* \* \*